US009661753B1

(12) United States Patent
Jandzio et al.

(10) Patent No.: US 9,661,753 B1
(45) Date of Patent: May 23, 2017

(54) COAXIAL TO PLANAR STRAIN RELIEF APPLIANCE AND METHOD

(71) Applicant: HARRIS CORPORATION, Melbourne, FL (US)

(72) Inventors: Gregory M. Jandzio, Melbourne, FL (US); Brinnan C. Riley, West Melbourne, FL (US); Charlie Dull, Palm Bay, FL (US); Jason Naylor, Palm Bay, FL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 15/366,158

(22) Filed: Dec. 1, 2016

(51) Int. Cl.
    H01R 9/00     (2006.01)
    H05K 1/18     (2006.01)
    H05K 3/34     (2006.01)

(52) U.S. Cl.
    CPC .......... H05K 1/182 (2013.01); H05K 3/34 (2013.01); *H05K 2201/10287* (2013.01); *H05K 2201/2027* (2013.01)

(58) Field of Classification Search
    CPC .. H05K 1/182; H05K 3/34; H05K 2201/2027; H05K 2201/10287; H05K 2201/10303
    USPC ......................................................... 361/772
    See application file for complete search history.

(56) References Cited

U.S. PATENT DOCUMENTS

| | | | |
|---|---|---|---|
| 3,783,321 A * | 1/1974 | Patterson ................ | H01P 1/125 174/663 |
| 4,422,128 A | 12/1983 | Zurlinden et al. | |
| 4,674,817 A | 6/1987 | Olms | |
| 4,715,821 A | 12/1987 | Axell | |
| 5,281,150 A | 1/1994 | Bundga et al. | |
| 5,402,088 A * | 3/1995 | Pierro ..................... | H01P 5/085 333/260 |
| 5,532,659 A * | 7/1996 | Dodart ................. | H01R 9/0515 333/260 |
| 5,618,205 A | 4/1997 | Riddle et al. | |
| 5,897,384 A | 4/1999 | Hosler, Sr. | |
| 5,982,338 A | 11/1999 | Wong | |
| 6,774,742 B1 | 8/2004 | Fleury et al. | |
| 6,842,084 B2 | 1/2005 | Herstein | |
| 7,049,903 B2 * | 5/2006 | Herstein ................. | H01P 5/085 333/33 |
| 7,277,297 B2 | 10/2007 | Ahmad et al. | |
| 8,125,292 B2 * | 2/2012 | Eppich ................... | H01P 5/085 333/260 |
| 2004/0038587 A1 | 2/2004 | Yeung et al. | |
| 2013/0171868 A1 | 7/2013 | Gessford et al. | |

\* cited by examiner

*Primary Examiner* — Sherman Ng
(74) *Attorney, Agent, or Firm* — Fox Rothschild LLP; Robert J. Sacco; Carol E. Thorstad-Forsyth (57) ABSTRACT

Microclip appliance formed from a single conductive planar metal sheet includes portions defined along an elongated length including a pin receiver, a solder paddle and a bridge. The pin receiver includes first and second planar rings, and a spring bar extending from a periphery of the first ring to a periphery of the second ring. The solder paddle is comprised of a portion of the conductive metal sheet distal from the pin receiver and the bridge extends from a peripheral portion of the solder paddle to the second ring. Lateral bends are disposed along a length of the conductive planar metal sheet to facilitate the various portions of the microclip.

20 Claims, 4 Drawing Sheets

COAXIAL TO PLANAR STRAIN RELIEF APPLIANCE AND METHOD

BACKGROUND

Statement of the Technical Field

The technical field of this disclosure comprises electrical interconnects, and more particularly concerns systems and methods for coaxial to planar microwave radio frequency interconnections in radio frequency systems.

Description of the Related Art

Radio Frequency (RF) circuits often require interconnects between the inner or center conductor of a coaxial transmission cable and planar entities which are disposed on a Printed Wiring Board (PWB). For example, such interconnects are commonly utilized where a coaxial cable enters an electronics module or chassis containing a PWB with conductive traces The electrical interconnect between the inner conductor and the planar entity can create numerous design challenges. In part this is due to the competing requirements for the electrical and mechanical performance of the interconnect. For example, the interconnect will ideally facilitate an electrical connection having a consistent electrical frequency response. But from a mechanical perspective, the interconnect must be easy to fabricate and enable a low-cost highly repeatable assembly process. The interconnect and implementation should also be capable of accommodating differential thermo-elastic strains resulting from the inherent use of disparate coefficient-of-thermal-expansion (CTE) materials in the package design. Such strains can have adverse effects on electrical performance, mechanical durability, and interconnect life.

Conventional solutions for connecting planar printed wiring board traces to an inner conductor of the coaxial transmission line have involved various approaches. For low-rate custom pieces, a formed-in-place wire appliance can be fabricated by hand to connect a center conductor of the coaxial cable to the planar transmission line trace. But this method is labor intensive and it can be difficult to consistently produce connections which exhibit the same frequency response. Another solution involves machine formed wire or ribbon bonds between the planar entity and the center pin of the coaxial cable. However, these approaches can involve significant process variability and usually require special finishes and/or special processing equipment/tooling. Processing equipment and special tooling can be limited in their ability to physically access certain interconnect sites, which can restrict potential RF circuit design options. The wire or ribbon bonding methods can also involve onerous process development and durability validation testing.

A third alternative to the problem involves the use of a formed sheet metal appliance to facilitate the electrical connection between the coaxial cable center conductor and the planar entity. But conventional sheet metal appliances used for this purpose can have inconsistent supplier controlled geometries and conventionally involve complex flat-to-circular transitions. These conventional formed-metal appliances can also present issues with respect to durability and process requirements. Inconsistency of form and lack of inherent strain relief with traditional appliances often results in durability issues. Due to the complexity of forms there is limited availability of suppliers to tailor to specific applications. Plating and finish configurations typically available in the marketplace obligate certain design and processing constraints to ensure product reliability.

SUMMARY

Embodiments concern a diminutive, 2-dimensional, easily-formed appliance (hereinafter referred to as a microclip) and method of using same which facilitate an electrical connection between a center conductor of a coaxial transmission element and a planar entity in an RF circuit. The microclip appliance is formed from a single conductive planar metal sheet which includes portions defined along an elongated length thereof including a pin receiver, a solder paddle and a bridge. The pin receiver includes first and second planar rings, and a spring bar extending from a periphery of the first ring to a periphery of the second ring. The solder paddle is comprised of a portion of the conductive metal sheet distal from the pin receiver and the bridge extends from a peripheral portion of the solder paddle to the second ring.

The conductive planar metal sheet includes a plurality of lateral bends therein which are disposed along a length of the conductive planar metal sheet. At least a first bend is provided to align the first and second planar rings in first and second ring planes. Each ring plane has a different orientation such that the ring planes define between them a predetermined angle. The conductive planar metal sheet also has at least a second bend to orient the solder paddle in a paddle plane which is transverse to the first and second ring planes.

The first and second planar rings define first and second ring apertures which are centrally aligned along a ring axis of the microclip appliance. The ring apertures are configured for receiving in alignment with the ring axis a conductive metal pin associated with the center conductor of a coaxial transmission element. Notably, at least a portion of the pin receiver is configured to resiliently deform to facilitate insertion of the conductive metal pin through the first and second ring apertures.

Embodiments also concern a method for providing an electrical interconnect between a center conductor of a coaxial transmission element and a planar entity in an RF circuit. The method involves positioning a conductive metal pin comprising the center conductor in a position which is offset from a major surface of a printed wiring board (PWB). The conductive metal pin is engaged using the above-described microclip appliance to form an electrical connection. At least a portion of the pin receiver is resiliently deformed to facilitate insertion of the conductive metal pin within the first and second ring apertures. Thereafter, a bias force is applied to the conductive metal pin in a direction transverse to the ring axis using the first and second planar rings, whereby the conductive metal pin when inserted in the first and second rings is resiliently engaged. The resilient engagement can be temporarily disrupted by applying a compression force urging the rings toward each other in a direction aligned along the ring axis.

BRIEF DESCRIPTION OF THE DRAWINGS

Embodiments will be described with reference to the following drawing figures, in which like numerals represent like items throughout the figures, and in which.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

A microclip appliance as disclosed herein facilitates an electrical connection between a center conductor of a coaxial transmission element and a planar entity in an RF circuit. The microclip appliance offers numerous advantages over conventional center conductor connection methodologies and connection devices. For example, the microclip appliance will grip a conductive metal pin with a determinate amount of force which is highly consistent and repeatable between manufactured part lots. The microclip appliance can be easily fabricated with standard materials using low cost two-dimensional fabrication methods. This means that the appliance is economical and easily adapted to various different circuit/system geometries. These various geometries can include center conductor pin diameters, varying requirements for strain relief, and different circuit board offsets. Further, the highly repeatable geometry of the part facilitates consistent signal performance and yields predictable installation results. Various embodiments of the microclip appliance are described below in greater detail.

Figure 1:
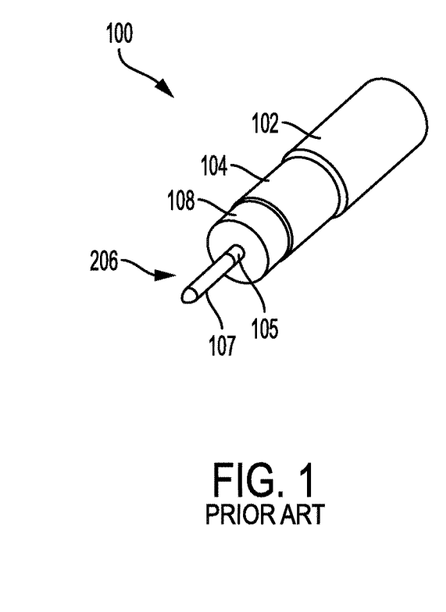
FIG. 1 is a drawing which is useful for understanding a coaxial transmission element having a center conductor.

In an RF circuit, it is sometimes necessary to transition from a coaxial signal transmission element to a planar entity, such as a planar conductive trace disposed on a PWB. The planar conductive trace can be a transmission line and/or may form a connection to a circuit component disposed on the PWB. As shown in FIG. 1 the coaxial signal transmission element 100 consists of a center conductor 105 which is surrounded by an insulating material 108. A conductive metal shield 104 is disposed around the insulating material 108. In some scenarios, the coaxial signal transmission element may also include a protective outer sheath 102 disposed around the exterior of the conductive metal sheath. As referenced herein the term coaxial transmission element can refer to an elongated coaxial cable and/or a portion of a coaxial RF connector.

Figure 2:
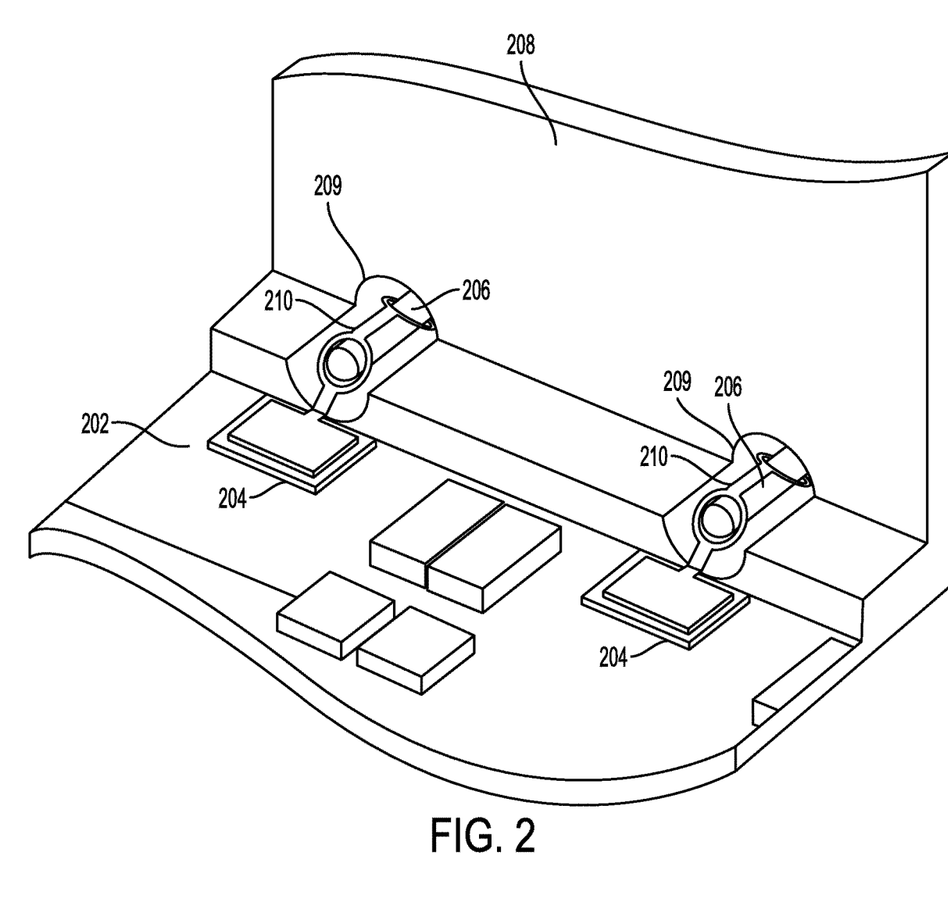
FIG. 2 is a drawing which is useful for understanding how an embodiment microclip interconnect is used to connect a conductive metal pin to a planar entity disposed on a PWB in an RF chassis.

When the coaxial signal transmission element is transitioned to a planar conductive trace on a PWB, the center conductor associated with the coaxial signal transmission element must be electrically connected to the conductive metal trace disposed on the PWB. Such a scenario is illustrated in FIG. 2 which shows conductive metal pins 206 which protrude through apertures 209 in a wall 208 of an RF chassis. The conductive metal pins 206 are electrically connected to a center conductor 105 of a coaxial signal transmission element. For example, the conductive metal pins 206 may comprise an exposed terminal end of a center conductor 105 in an elongated length of a coaxial cable. In such scenarios, the exposed center conductor may include a conductive metal cap 107 disposed on the center conductor to form the conductive metal pin 206. Alternatively, the conductive metal pin 206 may be a center conductor associated with a coaxial signal transmission element in the form of a coaxial connector. Such a connector may be provided to facilitate a terminal connection of an elongated length of coaxial transmission line cable.

As shown in FIG. 2, a PWB 202 includes conductive metal pads 204 disposed on a surface thereof. The metal pads 204 are adjacent to the locations where the conductive metal pins 206 protrude through the apertures 209. The conductive metal pads 204 are planar entities formed of a conductive metal. As such, the planar entities can comprise portions of RF transmission lines and/or may form electrical connections to other circuit components disposed on the PWB. For purposes of clarity, the circuit traces which would form these connections to other circuit components are omitted in FIG. 2. In an embodiment disclosed herein, an electrical connection between one or more of the conductive metal pins 206 and the conductive metal pads 204 is established by one or more microclip appliances 210. The microclip appliances are described below in further detail.

The various embodiments are described herein as facilitating a connection between a conductive metal pin associated with a coaxial signal transmission entity, but it should be understood that the embodiments are not limited in this regard. In some scenarios, the conductive metal pin can be associated with an electrical signal transmission path having a structure which is other than coaxial.

Figure 3:
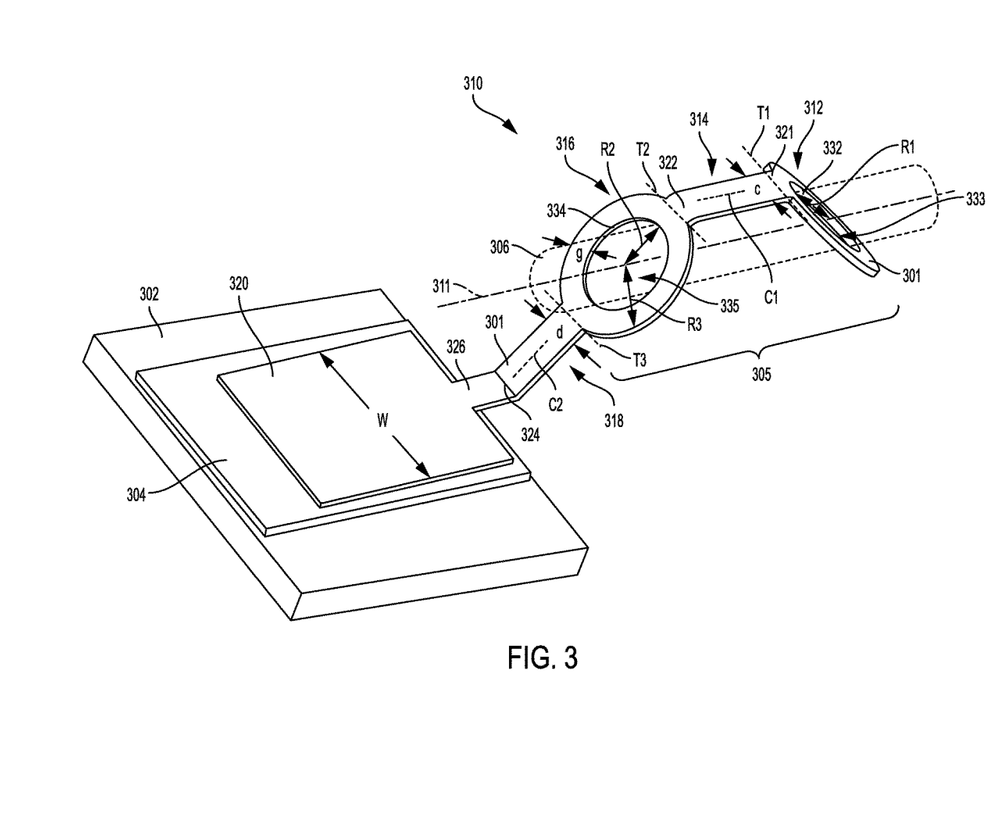
FIG. 3 is a perspective drawing which is useful for understanding an embodiment microclip.

An enlarged view of an embodiment microclip appliance 310 in accordance with one aspect is shown in FIG. 3. The microclip appliance 310 is comprised of a single conductive planar metal sheet 301 which extends in a direction aligned with a length of a ring axis 311. The microclip appliance includes various portions defined along an elongated length thereof. These portions include a pin receiver 305, a solder paddle 320 and a bridge 318. The conductive planar metal sheet can be comprised of a suitable metal such as heat-treated beryllium copper. Various types of metal and/or alloy plating such as gold, silver and solder can be disposed on portions the metal sheet.

A thickness of the planar metal sheet 301 can vary somewhat with the particular design requirements. However, an exemplary thickness can be in the range of between about 0.0005 to 0.008 inches. In some embodiments, the thickness of the metal sheet can be in the range of 0.001 to 0.003 inches. For example, a heat-treated beryllium copper sheet having a thickness of 0.002 inch, can be used in some embodiments. The various portions 305, 318 and 320 of the microclip appliance 310 can be formed by any suitable means. Exemplary processing steps can include photo-etching, stamping, and/or other types of two-dimensional fabrication methods which are commonly applicable to sheet metal production. However, due to the planar design of the microclip, complex metal forming and tooling is not needed.

The pin receiver 305 is comprised of first and second planar rings 312, 316 which are integrally formed with a spring bar 314. The spring bar 314 extends from a periphery of the first ring to a periphery of the second ring. According to one aspect, a centerline C1 defined along the length of the spring bar can be aligned with the ring axis 311. Further, centerline C1 can be aligned with a first and second inner diameter radius lines R1, R2 which are defined by the inner ring periphery 332, 334 of the first and second planar rings. Accordingly, in some embodiments, the centerline of the spring bar generally extends in a direction which is perpendicular or normal to parallel tangent lines T1 and T2 which are defined tangential to the first and second planar rings. A lateral width c of the spring bar is chosen to achieve a desired rigidity and/or spring rate to facilitate resilient engagement of a conductive metal pin 306 as hereinafter described. In some embodiments, the lateral width c of the spring bar can be chosen so that it is less than diameters 2*R1 and/or 2*R2 of first and second planar rings 312, 316.

The first and second planar rings 312, 316 can have a similar geometry which define first and second ring apertures 333, 335. The ring apertures are configured for receiving in alignment with the ring axis a conductive metal pin. Accordingly, the first and second ring apertures 333, 335 can be centrally aligned along the ring axis 311. The ring apertures can each have inner radii R1, R2 which are the same. Radii R1 and R2 are advantageously selected so that apertures 333, 335 defined by first and second planar ring 312, 316 will accommodate insertion therein of the conductive metal pin 306. To accommodate the conductive metal pin, inner radii R1 and R2 can be advantageously selected so that they are slightly larger than the diameter of the conductive metal pin 306 such that the pin fits snugly within the apertures 333, 335. Accordingly, the exact dimensions of radii R1 and R2 will depend to some extent on the outer diameter of the conductive metal pin 306 for which the microclip 310 is intended.

Each of the planar rings can also have an outer radius which is greater than its inner radius. For example, second planar ring 316 is shown to have an outer radius R3 which is greater than R2. A difference between R2 and R3 defines a ring thickness g. In some embodiments, the ring thickness g can be the same for the first and second planar rings, but embodiments are not limited in this respect and the ring thickness can be different in some scenarios. Still, the ring thickness in each case is advantageously chosen to ensure that each planar ring 312, 316 has sufficient rigidity to exert a predetermined spring bias force on the conductive metal pin.

The ring apertures 333, 335 can have a circular profile. However, it can be observed that the first and second planar rings 312, 316 are canted or angled somewhat with respect to the insertion direction of the conductive metal pin when aligned along ring axis 311. Accordingly, it can be advantageous in some embodiments to form the apertures 333, 335 with a shape that is oval rather than perfectly round so as to better accommodate the insertion therein of the conductive metal pin.

The solder paddle 320 is comprised of a portion of the conductive metal sheet 301 that is spaced apart from the pin receiver 305. In some embodiments, the solder paddle can have a square or rectangular profile as shown. The solder paddle may have a lateral width W which is relatively broader as compared to the width d of bridge 318. In such embodiments, the width of the microclip appliance can taper somewhat at a transition 326 from the solder paddle 320 to the bridge 318. This relatively broad lateral width of the solder paddle 320 may sometimes be useful to facilitate a mechanical and/or electrical characteristic of a soldered connection with a conductive planar element 304 disposed on PWB substrate 302. Still, the embodiments are not limited in this regard and the solder paddle 320 can in some scenarios have a lateral width W which is the same as or more narrow than the bridge 318.

The bridge 318 extends from transition 326 at a peripheral portion of the solder paddle to the periphery of the second ring 316. The lateral width d of the bridge can be chosen so that is less than the diameter of first and second planar rings 312, 316. In some embodiments, the lateral width d of the bridge 318 can be the same as the lateral width c of the spring bar. The width d can also be less than a diameter of each of the second planar ring 316. Still, embodiments are not limited in this regard and the lateral width dimension of the bridge is not considered critical provided that it does not interfere with other aspects of the RF circuit. In this regard it should be noted that the bridge 318 performs certain strain relief functions.

In some scenarios, a small amount of deflection or movement of the conductive metal pin 306 can occur with respect to the ring axis 311. This movement results in a displacement of the conductive metal pin 306 relative to the PWB 302. The movement of the conductive metal pin will be imparted to the microclip 310 and can potentially cause damage to the electrical connection between the solder paddle 320 and conductive planar element 304. But since the bridge 318 is formed of a relatively thin sheet metal, it is not perfectly rigid. Consequently, the bridge has the ability to deform or flex slightly to accommodate displacements or misalignments which can occur between the conductive metal pin 306 and the conductive planar element 304. From the foregoing it will be appreciated that the lateral width d of the bridge can negatively affect this ability to flex if it is made too large and must be considered as part of the design.

According to one aspect, a centerline C2 defined along the length of the bridge 318 can lie in a common plane with centerline C1 and ring axis 311. Further, centerline C2 can be aligned with second radius line R2 defined by the second planar ring 316. As such, the centerline C2 can extend in a direction which is perpendicular or normal to tangent line T3. Tangent line T3 is tangential to the second planar ring 316 and generally parallel to T2.

Figure 4:
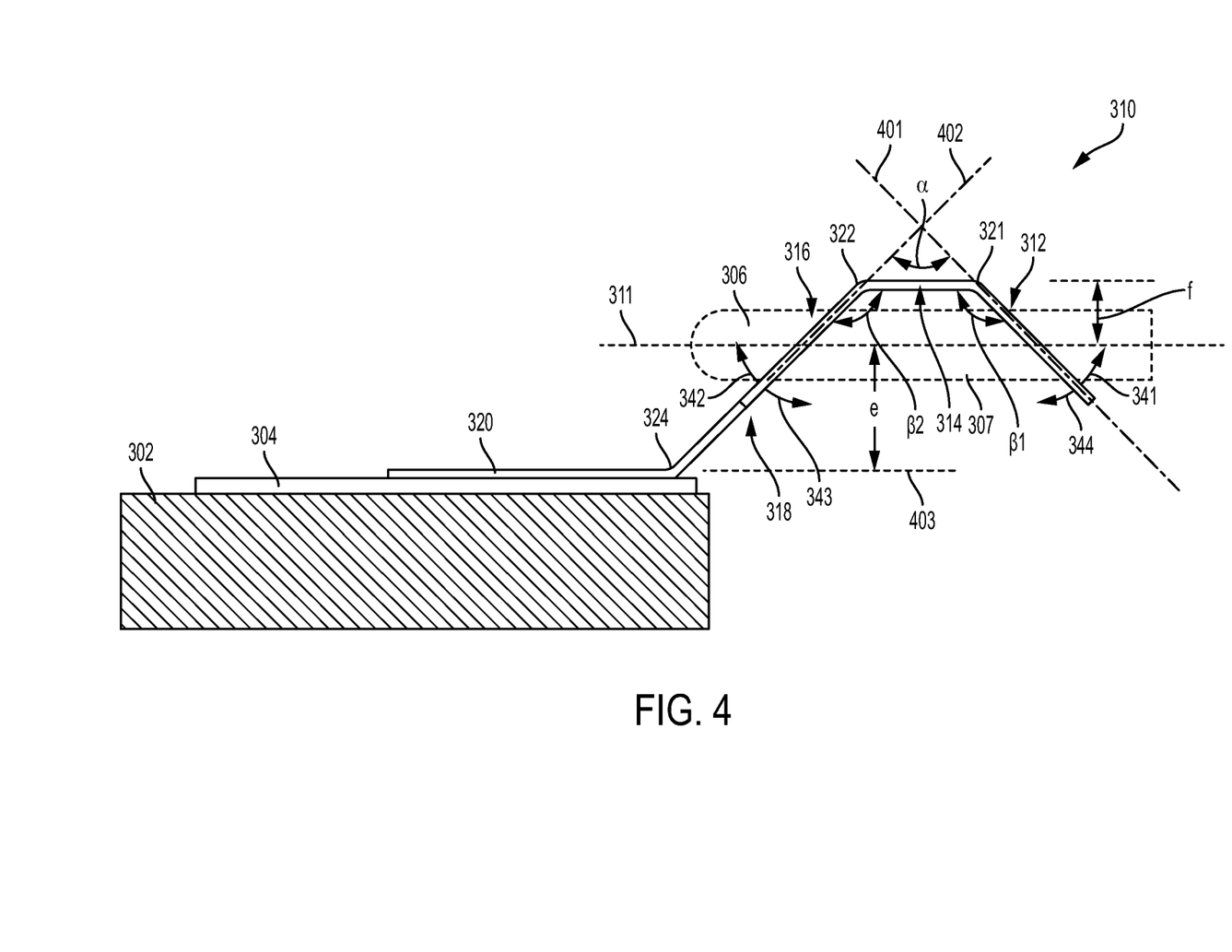
FIG. 4 is a side view of the embodiment microclip shown in FIG. 3.

The conductive planar metal sheet 301 includes a plurality of lateral bends therein which are disposed along a length of the conductive planar metal sheet. These lateral bends are transverse to the direction of the ring axis 311. More particularly, the lateral bends can extend in directions which are perpendicular to the direction of the ring axis 311. Referring now to FIGS. 3 and 4, it can be observed that the lateral bends will include at least a first bend to align the first and second planar rings in first and second ring planes 401, 402, each having a different orientation and defining between them a predetermined angle α. In some embodiments, the predetermined angle can have a range of between about 30 to 110 degrees. However, other values for the predetermined angle α are also possible provided that the apertures 333, 335 can be sufficiently aligned to receive a conductive metal pin 306 along the ring axis 311.

Figure 5:
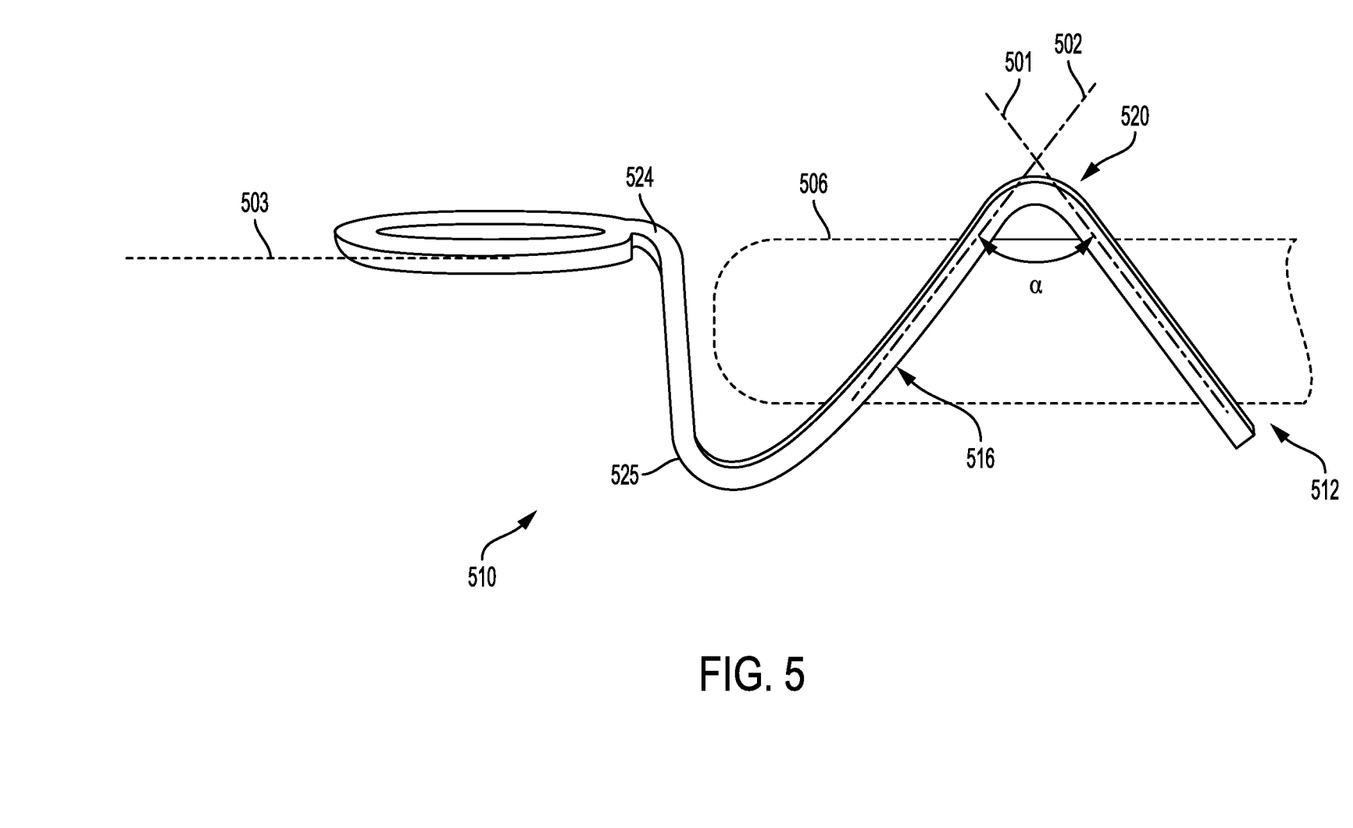
FIG. 5 is a side view of an alternative embodiment microclip.

In some embodiments two lateral bends 321, 322 can be provided to orient the first and second planar rings in the first and second ring planes 401, 402. However, the invention is not limited in this regard and more or fewer bends can be used to achieve a similar effect. For example, FIG. 5 shows an exemplary embodiment of a microclip 510 disposed on a conductive metal pin 506. The microclip 510 is similar to the microclip 310, but only a single lateral bend 520 is used to orient the first and second planar rings 512, 516 in the first and second ring planes 501, 502.

In the embodiment shown in FIGS. 3 and 4, the lateral bends 321, 322 define angles β1 and β2 respectively between each ring plane and the spring bar. Consequently, the angles β1 and β2 will in combination determine angle α. The angles β1 and β2 can be the same or equal as shown in FIG. 4, such that the spring bar 314 extends in a direction parallel to the ring axis 311. But the embodiments are not limited in this regard, and in some scenarios angles β1 and β2 can be different. Still, it is advantageous for angles β1 and β2 to each be formed as obtuse angles so as to facilitate the resilient engagement of conductive metal pin 306 as described herein.

As shown in FIGS. 3 and 4, the lateral bends 321, 322 can be approximately aligned respectively along tangent lines T1 and T2 so that the spring bar is aligned with and spaced apart a distance f from the ring axis 311. This provides the microclip with a relatively compact design while ensuring that operation of the planar rings is not adversely affected by such lateral bends. However, in some scenarios it can be advantageous to form one or both of the lateral bends 321, 322 so that they are offset from the tangent lines T1 and/or T2. For example, in the lateral bends 321, 322 can be spaced apart from one or both tangent lines so that the bends are more closely spaced along the spring bar. Alternatively, the lateral bends can encroach somewhat upon one or both of the planar rings, provided that such encroachment does not otherwise interfere with or prevent the insertion of conductive metal pin within the ring apertures.

The plurality of lateral bends can further include at least one bend 324 to orient the solder paddle 320 in a paddle plane 403 which is transverse to the first and second ring planes 401, 402. The paddle plane 403 can be offset from a ring axis 311 to facilitate a connection to conductive planar element 304 disposed on a surface of PWB 302. In some embodiments, a plurality of lateral bends can be used for this purpose. For example, FIG. 5 shows an embodiment microclip 510 in which two lateral bends 524, 525 are used orient the solder paddle in a paddle plane 503 which is transverse to the first and second ring planes 501, 502. As shown in FIGS. 3-5 the paddle plane can be displaced relative to the ring axis. The magnitude of the displacement and the direction of the displacement relative to the ring axis will depend upon various design factors. For example, these design choices can be based on an anticipated PWB offset relative to the placement of a conductive metal pin. The displacement can also be selected to facilitate strain relief and/or other circuit packaging requirements.

In an embodiment microclip disclosed herein, at least a portion of the pin receiver is configured to resiliently deform to facilitate insertion of the conductive metal pin within the first and second ring apertures. For example, with reference to FIG. 4 a resilient deflection of spring bar 314 during insertion of conductive metal pin 306 can facilitate pin insertion within the ring apertures and can subsequently facilitate a spring force 341, 342 being exerted upon the conductive metal pin by the first and second planar rings 312, 316 as shown. The pin receiver is configured to allow the resilient deformation of the spring bar and/or portions of the first and second planar rings. This deformation results in a bias force by the first and second rings in a direction transverse to the ring axis 311. Consequently, the conductive metal pin 306, when inserted in the first and second rings, can be securely engaged by the inner ring periphery 332, 334 of the first and second planar rings. More particularly, once the pin is inserted in the apertures 333, 335 as shown, the inner ring periphery of each of the first and second rings exerts a spring bias force 341, 342 upon an elongated side wall 307 of the conductive metal pin.

To facilitate insertion of the conductive metal pin within the apertures 333, 335 the pin receiver 310 is responsive to compression forces urging the first and second planar rings toward one another in directions 343, 344. This operation temporarily can involve deflection of the spring bar and/or portions of the first and second planar rings. This deflection reduces the angle α between the first and second ring planes 401, 402 to suspend or reduce the engagement force applied upon the conductive metal pin by the inner ring peripheries 332, 334. Accordingly, when the angle of a is reduced in this way, the conductive metal pin can be easily inserted and/or removed from the pin receiver.

The embodiment microclips 310, 510 disclosed herein also facilitate a method for providing an electrical interconnect between a center conductor of a coaxial transmission element and a planar entity, (e.g., conductive planar element 304) in an RF circuit. The method involves positioning a conductive metal pin (e.g., conductive metal pin 306) comprising the center conductor in a position which is offset from a major surface of a printed wiring board (PWB) 302. This offset is best understood with reference to FIG. 4 as a distance e between ring axis 311 and paddle plane 403. The conductive metal pin is engaged using the above-described microclip appliance to form an electrical connection as shown in FIGS. 2-4.

According to one aspect, at least a portion of the pin receiver 305 is resiliently deformed to facilitate insertion of the conductive metal pin 306 within the first and second ring apertures. Thereafter, a bias force 341, 342 is applied to the conductive metal pin in a direction transverse to the ring axis 311 using the first and second planar rings. Accordingly, the conductive metal pin, when inserted in the first and second rings, is resiliently engaged. The method can also involve releasing the conductive metal pin from its engagement by the pin receiver. The resilient engagement can be temporarily disrupted by applying a compression force urging the planar rings toward each other so the rings pivot or flex in a direction 343, 344 aligned along the ring axis.

The microclip embodiments disclosed herein have numerous advantages over conventional clips and methods which are used for connecting a conductive metal pin (such as a coaxial signal element center conductor) to a planar entity disposed on PWB. The flat or planar arrangement of the part allows it to be easily fabricated and heat treated using simple tooling. Because the microclip is formed as a plurality of planar sections, with simple bends, inexpensive 1-dimensional forming processes can be applied to yield predictable geometries. This low cost fabrication methodology allows the part to be easily manufactured by multiple vendors while avoiding manufacturing variances and the necessity for single vendor sourcing. The result is consistent fatigue performance and predictable installation results. The forces applied to the conductive metal pin from the resulting part are determinate and can be precisely controlled since they are based on elastic strain. Further, the design is easily adapted to different geometries involving various pin diameters, strain relief requirements and PWB offsets with respect to the conductive metal pin axis. Finally, the microclip is easily installed and removed by applying compression forces to opposing faces of the planar rings.

A further advantage of the microclip disclosed herein concerns the electrical performance characteristics. Computer modeling shows that when compared to conventional microclip designs used for similar purposes, the embodiments disclosed herein have equal or better RF performance with regard to insertion loss and return loss. Accordingly, the part can serve as a drop in replacement for conventional interconnect designs which are currently used for similar purposes.

Reference throughout this specification to "one embodiment", "an embodiment", or similar language means that a particular feature, structure, or characteristic described in connection with the indicated embodiment is included in at least one embodiment. Thus, the phrases "in one embodiment", "in an embodiment", and similar language throughout this specification may, but do not necessarily, all refer to the same embodiment.

Although the embodiments have been illustrated and described with respect to one or more implementations, equivalent alterations and modifications will occur to others skilled in the art upon the reading and understanding of this specification and the annexed drawings. Thus, the breadth and scope of the embodiments disclosed herein should not be limited by any of the above described embodiments. Rather, the scope of the invention should be defined in accordance with the following claims and their equivalents.

We claim:

1. A microclip appliance which facilitates an electrical connection between a center conductor of a coaxial transmission element and a planar entity in an RF circuit, comprising:
a single conductive planar metal sheet which includes portions defined along an elongated length thereof including a pin receiver, a solder paddle and a bridge;
the pin receiver comprised of first and second planar rings, and a spring bar extending from a periphery of the first ring to a periphery of the second ring,
the solder paddle comprising a portion of the conductive metal sheet distal from the pin receiver; and
the bridge extending from a peripheral portion of the solder paddle to the second ring;
wherein the conductive planar metal sheet includes a plurality of lateral bends therein which are disposed along a length of the conductive planar metal sheet, including
at least a first bend to align the first and second planar rings in first and second ring planes, each having a different orientation and defining between them a predetermined angle, and
at least a second bend to orient the solder paddle in a paddle plane transverse to the first and second ring planes.

2. The microclip appliance according to claim 1, wherein the first and second planar rings define first and second ring apertures which are centrally aligned along a ring axis of the microclip appliance.

3. The microclip appliance according to claim 2, wherein the ring apertures are configured for receiving in alignment with the ring axis a conductive metal pin associated with the center conductor.

4. The microclip appliance according to claim 3, wherein at least a portion of the pin receiver is configured to resiliently deform to facilitate insertion of the conductive metal pin within the first and second ring apertures.

5. The microclip appliance according to claim 4, wherein the pin receiver is configured so that the resilient deformation results in a bias force by the first and second rings in a direction transverse to the ring axis, whereby the conductive metal pin when inserted in the first and second rings can be resiliently engaged and retained.

6. The microclip appliance according to claim 5, wherein each of the first and second ring apertures is configured to exert said bias force upon an elongated side wall of the conductive metal pin when inserted in said first and second ring apertures.

7. The microclip appliance according to claim 5, wherein said pin receiver is responsive to a compression force urging the first and second ring apertures toward one another to temporarily suspend the resilient engagement of the conductive metal pin.

8. The microclip appliance according to claim 1 wherein the plurality of lateral bends includes at least two bends in the pin receiver to align the first and second planar rings in the first and second ring planes.

9. The microclip appliance according to claim 1 wherein the plurality of lateral bends includes at least two bends in the bridge to orient the solder paddle in the paddle plane transverse to the first and second ring planes.

10. The microclip appliance according to claim 1, wherein the spring bar extends from the periphery of the first ring to the periphery of the second ring in a direction aligned with a second radius of the first ring.

11. A method for providing an electrical interconnect between a center conductor of a coaxial transmission element and a planar entity in an RF circuit, comprising:
positioning a conductive metal pin comprising the center conductor in a position which is offset from a major surface of a printed wiring board;
engaging the conductive metal pin using a microclip appliance to form an electrical connection; and
selecting the microclip appliance formed of a single conductive planar metal sheet which includes portions defined along an elongated length thereof including a pin receiver, a solder paddle and a bridge;
the pin receiver comprised of first and second planar rings, and a spring bar extending from a periphery of the first ring to a periphery of the second ring,
the solder paddle comprised of a portion of the conductive metal sheet distal from the pin receiver; and
the bridge extending from a peripheral portion of the solder paddle to the second ring;
wherein the conductive planar metal sheet includes a plurality of lateral bends therein which are disposed along a length of the conductive planar metal sheet, including
at least a first bend to align the first and second planar rings in first and second ring planes, each having a different orientation and defining between them a predetermined angle, and
at least a second bend to orient the solder paddle in a paddle plane transverse to the first and second ring planes.

12. The method according to claim 11, further comprising selecting the first and second planar rings to include first and second ring apertures which are centrally aligned along a ring axis of the microclip appliance.

13. The method according to claim 12, further comprising selecting a configuration of the ring apertures to facilitate receiving in alignment with the ring axis the conductive metal pin.

14. The method according to claim 13, further comprising resiliently deforming at least a portion of the pin receiver to facilitate insertion of the conductive metal pin within the first and second ring apertures.

15. The method according to claim 14, further comprising applying a bias force to the conductive metal pin in a direction transverse to the ring axis using the first and second planar rings, whereby the conductive metal pin when inserted in the first and second rings is resiliently engaged and retained.

16. The method according to claim 15, further comprising exerting said bias force upon an elongated side wall of the conductive metal pin when the conductive metal pin is inserted in said first and second ring apertures.

17. The method according to claim 15, further comprising applying a compression force to urge the first and second ring apertures toward one another to temporarily suspend the resilient engagement of the conductive metal pin.

18. The method according to claim 11, further comprising selecting the plurality of lateral bends to include at least two bends in the pin receiver to align the first and second planar rings in the first and second ring planes.

19. The method according to claim 11, further comprising selecting the plurality of lateral bends to include at least two bends bend in the bridge to orient the solder paddle in a paddle plane transverse to the first and second ring planes.

20. The method according to claim 11, further comprising selecting the spring bar to extend from the periphery of the first ring to the periphery of the second ring in a direction aligned with a second radius of the first ring.

* * * * *